(12) United States Patent
de Cesare et al.

(10) Patent No.: US 8,862,926 B2
(45) Date of Patent: Oct. 14, 2014

(54) HARDWARE CONTROLLED PLL SWITCHING

(75) Inventors: Josh P. de Cesare, Campbell, CA (US); Jung Wook Cho, Cupertino, CA (US); Toshinari Takayanagi, San Jose, CA (US)

(73) Assignee: Apple Inc., Cupertino, CA (US)

( * ) Notice: Subject to any disclaimer, the term of this patent is extended or adjusted under 35 U.S.C. 154(b) by 531 days.

(21) Appl. No.: 13/211,004

(22) Filed: Aug. 16, 2011

(65) Prior Publication Data

US 2013/0043917 A1    Feb. 21, 2013

(51) Int. Cl.
*G06F 1/06* (2006.01)
*H03L 7/07* (2006.01)
*G06F 1/10* (2006.01)

(52) U.S. Cl.
CPC ... *H03L 7/07* (2013.01); *G06F 1/10* (2013.01)
USPC .......................................... 713/501; 713/500

(58) Field of Classification Search
CPC .......................................................... G06F 1/10
USPC ................................................. 713/500, 501
See application file for complete search history.

(56) References Cited

U.S. PATENT DOCUMENTS

| | | |
|---|---|---|
| 5,465,059 A | 11/1995 | Pan et al. |
| 5,553,021 A | 9/1996 | Kubono et al. |
| 5,790,609 A | 8/1998 | Swoboda |
| 6,347,119 B2 | 2/2002 | Matsumura et al. |
| 6,426,972 B1 | 7/2002 | Endres et al. |
| 6,624,681 B1 | 9/2003 | Loyer et al. |
| 6,647,017 B1 | 11/2003 | Heiman |
| 6,717,484 B2 | 4/2004 | Ben-Ayun et al. |
| 6,754,241 B1 | 6/2004 | Krishnamurthy et al. |
| 6,971,038 B2 | 11/2005 | Santhanam et al. |
| 7,193,543 B1 | 3/2007 | McLeod et al. |
| 7,256,655 B2 | 8/2007 | He |

(Continued)

FOREIGN PATENT DOCUMENTS

EP    2282265    2/2011

OTHER PUBLICATIONS

DTA-120 Product Specification, "DVB/ASI Input Adapter for PCI Bus," DEKTEC Digital Video BV, Jul. 2003, 30 pages.

(Continued)

*Primary Examiner* — Albert Wang
(74) *Attorney, Agent, or Firm* — Rory D. Rankin; Meyertons, Hood, Kivlin, Kowert & Goetzel, P.C.

(57) ABSTRACT

A system and method for efficiently managing multiple PLLs on a system on a chip (SOC). A SOC includes a hardware phase lock loop (PLL) switching control block coupled to a software interface. The hardware PLL switching (HPS) control block receives PLL switch requests from software. The request identifies a given core clock received by a given processing core of multiple processor cores on the SOC and indicates the identified core clock is not to be provided anymore by a current PLL. The request indicates a given search method including search conditions. The HPS control block searches for a target PLL that satisfies these search conditions. In response to finding the target PLL, the HPS control block changes clock network connections and parameters across the die of the SOC. These changes across the die disconnect the identified core clock from the current PLL and connects the identified core clock to the target PLL.

22 Claims, 10 Drawing Sheets

(56) References Cited

U.S. PATENT DOCUMENTS

| | | | |
|---|---|---|---|
| 7,289,538 B1 | 10/2007 | Paradise et al. | |
| 7,437,583 B2 | 10/2008 | Lu | |
| 7,475,374 B1 | 1/2009 | Johnson et al. | |
| 7,565,564 B2 * | 7/2009 | Kuo et al. | 713/500 |
| 7,580,691 B1 | 8/2009 | Reed et al. | |
| 7,634,028 B2 | 12/2009 | Crawley | |
| 7,787,569 B2 | 8/2010 | Hayem et al. | |
| 7,804,920 B2 | 9/2010 | Deisher et al. | |
| 2003/0185238 A1 | 10/2003 | Strasser et al. | |
| 2003/0189953 A1 | 10/2003 | Matsumura et al. | |
| 2004/0145400 A1 | 7/2004 | Mariggis | |
| 2008/0307240 A1 | 12/2008 | Dahan et al. | |
| 2008/0317185 A1 | 12/2008 | Mueller et al. | |
| 2009/0138745 A1 | 5/2009 | Dorsey et al. | |
| 2010/0228955 A1 | 9/2010 | Niggemeier et al. | |

OTHER PUBLICATIONS

Harmonic Inc., "Narrowcast Services Gateway," www.harmonicinc.com/view_csd_product_group.cfm?classID=1040, 2 pages. [Retrieved Mar. 24, 2005].

Harmonic Inc., Digital Video Products, "Narrowcast Services Gateway NSG 8000 Family," 2005, 4 pages.

Harmonic Inc., Digital Video Products, "Narrowcast Services Gateway NSG Family," 2003, 4 pages.

"Model D9479 Gigabit QAM Modulator," Scientific Atlanta, Part No. 4005270 Rev A, Jan. 2004, 3 pages.

Motorola, "SEM SmartStream Encryptor Modulator," 2002, 2 pages.

Cisco Systems,"Cisco UMG9850 QAM Module," www.cisco.com/en/US/products/hw/video/ps5648/5649/, 2 pages. [Retrieved Mar. 24, 2005].

Cisco Systems, "Cisco UMG980 Series Digital Video Networking Products: Cisco uMG9850 QAM Module Data Sheet," printed from the internet: http://www.cisco.com/warp/public/cc/pd/mxsv/prodlit/9850d_ds.pdf, 4 pages. [Retrieved Mar. 24, 2005].

Didier Le Gall, "MPEG: A Video Compression Standard for Multimedia Applications," Communications of the ACM, vol. 34, No. 4. Apr. 1991, pp. 47-58.

* cited by examiner

PLL Search State Table 600

| PLL Search Method ID 610 | PLL Search and Switch Steps 620 |
|---|---|
| 0 | Switch request-identified core clock to a request-identified PLL. Do not change the settings of the identified PLL. |
| 1 | Change the settings of a request-identified PLL to request-identified settings. Switch request-identified core clock to the identified PLL. |
| 2 | Identify PLL corresponding to request-identified core clock. Identify subset of PLLs able to provide the identified core clock. Identify a PLL in the subset next to the identified PLL. Sequentially search enabled PLLs in the subset that do not currently provide core clocks beginning with the identified next PLL. Change the settings of a found PLL to request-identified settings. Switch request-identified core clock to the found PLL. |
| 3 | Identify PLL corresponding to request-identified core clock. Identify subset of PLLs able to provide the identified core clock. Identify a PLL in the subset next to the identified PLL. Sequentially search disabled PLLs in the subset. Change the settings of a found PLL to request-identified settings. Switch request-identified core clock to the found PLL. |
| 4 | Identify subset of PLLs able to provide the identified core clock. Sequentially search enabled PLLs in the subset that have the same settings as request-identified settings. Switch request-identified core clock to a found PLL. Go to Method 2 if no PLL found. |
| 5 | Identify subset of PLLs able to provide the identified core clock. Sequentially search enabled PLLs in the subset that have the same settings as request-identified settings. Switch request-identified core clock to a found PLL. Go to Method 3 if no PLL found. |

*FIG. 6*

HARDWARE CONTROLLED PLL SWITCHING

BACKGROUND OF THE INVENTION

1. Field of the Invention

This invention relates to computing systems, and more particularly, to efficiently managing multiple PLLs on a system on a chip (SOC).

2. Description of the Relevant Art

A system-on-a-chip (SOC) integrates multiple functions into a single integrated chip substrate. The functions may include digital, analog, mixed-signal and radio-frequency (RF) functions. Typical applications are used in the area of embedded systems. Energy-constrained cellular phones, portable communication devices and entertainment audio/video (A/V) devices are some examples of systems using an SOC. An SOC may use powerful processors that execute operating system (OS) software. In addition, the SOC may be connected to both external memory chips, such as Flash or RAM, and various external peripherals.

The power consumption of integrated circuits (ICs), such as modern complementary metal oxide semiconductor (CMOS) chips, is proportional to at least the expression $fV^2$. The symbol f is the operational frequency of the chip. The symbol V is the operational voltage of the chip. In modern microprocessors, both parameters f and V may be varied during operation of the IC. For example, during operation, modern processors allow users to select one or more intermediate power-performance states between a maximum performance state and a minimum power state.

During the execution of applications on embedded systems, a powerful processor may not be the leading energy-consumer when high-performance memories, color displays, and other functions are being used. An overriding power management goal in portable systems is to reduce system-wide energy consumption. A dynamic power management system on an SOC may support multiple power management policies that allow device manufacturers to specialize policies for their applications and differentiate their products based on their own unique approaches to power management. In addition, as integration increases on a SOC, so do a number of different active clocks and a number of phase lock loops (PLLs) to support the clocks.

Embedded systems may not have a basic-input-output-software (BIOS) or machine abstraction layer to insulate the OS from low-level device and power management. Therefore, the kernel in the OS may handle these tasks. As integration on an SOC increases, the interrelationships between clock sources and power management modes become more complex. Further, other tasks become increasingly difficult, such as switching core clocks between sources (PLLs) of clocks effectively, managing the stopping, starting and relocking of the PLLs, and reconfiguring the PLLs. These increasingly difficult tasks may become burdensome on the software leading to less flexibility on the management of the PLLs.

In view of the above, efficient methods and mechanisms for efficiently managing multiple PLLs on a system on a chip (SOC) are desired.

SUMMARY OF EMBODIMENTS OF THE INVENTION

Systems and methods for efficiently managing multiple PLLs on a system on a chip (SOC) are contemplated. In one embodiment, a SOC includes a hardware phase lock loop (PLL) switching control block coupled to a software interface. The hardware PLL switching (HPS) control block may receive PLL switch requests from software. The request may indicate a given search method for finding a target PLL including one or more search conditions. The request may identify a given core clock received by a given processing core of multiple processor cores on the SOC. The request may indicate the identified core clock is not to be provided anymore by a current PLL of the multiple PLLs. The HPS control block may search for a given one of the multiple PLLs on the SOC to be a target PLL. The target PLL may satisfy conditions specified in a search method indicated by the search request. In response to finding the target PLL, the HPS control block may change clock network connections and parameters across the die of the SOC. These changes across the die may disconnect the identified core clock from the current PLL and connect the identified core clock to the target PLL.

These and other embodiments will be further appreciated upon reference to the following description and drawings.

BRIEF DESCRIPTION OF THE DRAWINGS

FIG. 6 is a generalized block diagram illustrating one embodiment of a PLL search state table.

Figure 1:
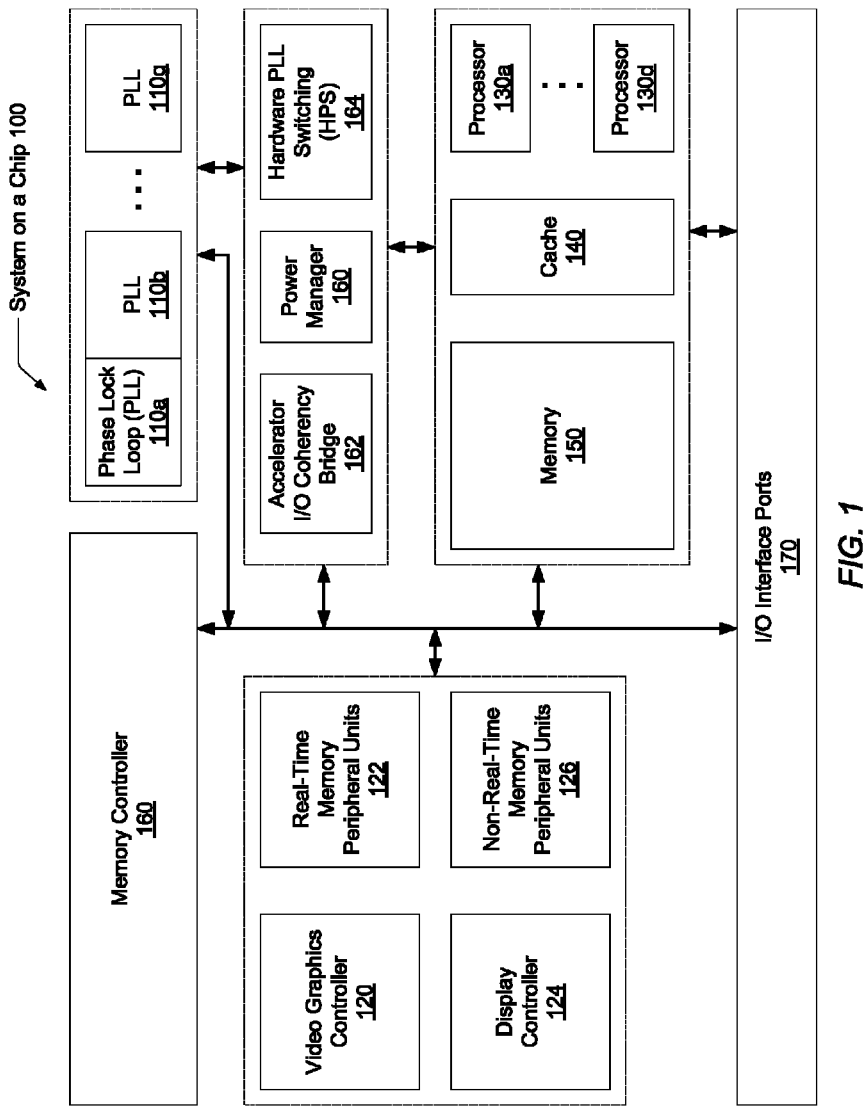
FIG. 1 is a generalized block diagram of one embodiment of a system-on-a-chip (SOC).

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the spirit and scope of the present invention as defined by the appended claims.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention.

Referring to FIG. 1, a generalized block diagram illustrating one embodiment of a system-on-a-chip (SOC) 100 is shown. The SOC 100 is an integrated circuit (IC) that includes multiple types of IC designs on a single semiconductor die, wherein each IC design provides a separate functionality. Traditionally, each one of the types of IC designs may have been manufactured on a separate silicon wafer. In the illustrated embodiment, the SOC 100 includes one or more clock sources, such as phase lock loops (PLLs) 110a-110g, a memory controller 160, various input/output (I/O) interfaces 170, a memory 150, which may be a non-volatile memory, and one or more processors 130a-130d with a supporting cache hierarchy that includes at least cache 140.

In addition, the SOC 100 may include other various analog, digital, mixed-signal and radio-frequency (RF) blocks. For example, the SOC 100 may include a video graphics controller 120, a display controller 124, real-time peripheral memory units 122 and non-real-time memory peripheral units 126. In order to process applications in an energy-efficient manner on the SOC 100, a central power manager 160 may be included.

The hardware (HW) PLL switching control 164 may be included within the power manager 160 or alternatively be a separate control block. The HW PLL switching control (HPS) 164 may turn on and turn off one or more of the PLLs 110a-110g. In addition, the HPS 164 may switch one or more core clocks routed on the SOC 100 from one PLL to a different PLL of the PLLs 110a-110g. The accelerator I/O coherency bridge 162 may provide efficient memory accesses for at least the processors 130a-130d and peripheral devices. Communication buses, a clock tree and other signal routing across the SOC 100 is not shown for ease of illustration.

The PLLs 110a-110g may supply source clock signals, which are routed through a clock tree (not shown) to be distributed across the die of the SOC 100 and to provide core clocks to the various processing blocks (processing cores) on the SOC 100. The SOC 100 may use one or more types of PLLs to generate the source clocks signals. For example, an integer PLL may be used. Alternatively, a fractional PLL may be used to generate multiple clock signals with different clock frequencies from a single clock crystal. As used herein, a processing core may be any processor or device configured to use a provided clock.

For an integer PLL, the frequency of an input signal is multiplied by a ratio of an integer value of a feedback divider within the PLL to an integer value within a pre-divider to generate an output frequency. When an integer PLL is unable to generate a given clock frequency value within a given threshold, two integer PLLs may be cascaded together.

An alternative to cascaded integer PLLs, the fractional PLL multiplies a frequency of an input signal by an integer and a fraction. The fraction value is generated by continuously changing the feedback divider within the PLL. For example, if a feedback divider alternates between dividing by an integer value of 9 and an integer value of 10, then the output frequency would be 9.5 times the frequency of the input signal. By changing a number of times a division is performed between the integer values of 9 and 10, different fraction values between 9 and 10 may be generated. However, sidebands or spurs at the frequency the divider is being switched may be generated. These spurs may cause interference with other circuitry on-chip and noise reduction techniques may be used to handle them.

The number of clock signals provided on the SOC 100 is a design choice and may depend on a number of clocks signals used by the processing blocks on the SOC 100. As integration on the SOC 100 increases, so does the number of clock signals to source and to route. System-wide energy consumption increases as more of the PLLs 110a-110g are turned on and are used. In order to reduce system-wide energy consumption, one or more of the core clocks may be switched to a different one of the PLLs 110a-110g in order to reduce a number of active PLLs. Due to a high number of PLLs 110a-110g and core clocks on the SOC 100, control of PLL switching may be burdensome for software to handle. Therefore, the HPS 164 may perform these tasks.

The central power manager 160 may be included in a general system controller (not shown). A general system controller may manage power-up sequencing of the various processing blocks on the SOC 100 and control multiple off-chip devices via reset, enable and other signals conveyed through the I/O interface ports 170. A general system controller may also manage communication between the various processing blocks on the multiple buses on the SOC 100. The power manager 160 may include power management policies for multiple processing blocks on the SOC 100. One or more of the processing blocks, such as the processors 130a-130d, GPUs, DSPs, other SIMD cores, and so forth may include internal power management techniques. However, to manage system-wide energy consumption, the power manager 160 may alter one or more operating voltages and operating frequencies to the processing blocks on the SOC 100.

In addition, the power manager 160 may indicate a given core clock to be switched from utilizing a first source clock to a second source clock. One or more power management algorithms running in a kernel of an operating system (OS) may direct the power manager 160 to perform this PLL switch. For example, a core clock routed to processor 130a may be switched from using PLL 110a to PLL 110b. This indication may be sent from the power manager 160 to the HPS 164. Alternatively, the kernel of the OS may directly communicate with the HPS 164.

Continuing with the above PLL switching mechanism, software may issue a PLL switch operation to be performed. This operation may identify a core clock to be switched. In addition, the operation may identify a targeted PLL to be switched to and for generating a source clock to be used for providing the identified core clock. Alternatively, the operation may identify a method for searching for a targeted PLL, rather than specify a targeted PLL. The operation may additionally provide divisor values to be used in the targeted PLL. In one embodiment, these divisor values may include a pre-divider integer value and a feedback divider integer value to be used in an integer PLL. The circuitry within the HPS 164 may handle the procedures for performing the switch. In one embodiment, the procedures may include (i) enabling the targeted PLL if it is not already enabled, (ii) loading the divisor values into the targeted PLL, (iii) locking the targeted PLL, (iv) connecting a generated source clock from the targeted PLL to a clock tree, or clock switching network across the die of the SOC 100, in order to provide the core clock, and (v) disabling a PLL previously used to generate the identified core clock. Before continuing with more details of the PLL switching mechanism, a further description of the SOC 100 is provided below.

Each one of the processors 130a-130d may include one or more cores and one or more levels of a cache memory subsystem. Each core may support the out-of-order execution of one or more threads of a software process and include a multi-stage pipeline. Each one of the processors 130a-130d may include circuitry for executing instructions according to a predefined general-purpose instruction set. For example, the PowerPC® instruction set architecture (ISA) may be selected. Alternatively, the x86, x86-64®, Alpha®, MIPS®, PA-RISC®, SPARC® or any other instruction set architecture may be selected.

Generally, each of the one or more cores within each of the processors 130a-130d accesses an on-die level-one (L1) cache within a cache memory subsystem for data and instructions. The processors 130a-130d may include multiple on-die levels (L2, L3 and so forth) of caches. If a requested block is not found in the on-die caches or in the off-die cache 140, then a read request for the missing block may be generated and transmitted to the memory 150. The memory 150 may be a non-volatile memory block formed from an array of flash memory cells and a memory controller (not shown) for the array. Alternatively, the memory 150 may include other non-volatile memory technology. The memory 150 may be divided into separate addressable arrays to be used by the processors 130a-130d and other processing blocks on the SOC 100. Each addressable array may have its own memory controller. The number of data inputs and outputs and address inputs will depend on the size of the array used.

The processors 130a-130d may share the memory 150 with other processing blocks, such as graphics processing units (GPUs), application specific integrated circuits (ASICs), and other types of processor cores. Therefore, typical SOC designs utilize acceleration engines, or accelerators, to efficiently coordinate memory accesses and support coherency designs between processing blocks and peripherals. In a SOC designs that includes multiple processors and processing blocks, these components communicate with each other to control access to shared resources. Memory coherence may be managed in software, in the accelerator I/O coherence bridge 162, or both. The bridge 162 may also connect low-bandwidth, direct memory access (DMA)-capable 10 devices to the memory 150 via an accelerator coherency port (ACP) on one or more of the processors 130a-130d. For off-chip memory requests, the memory controller 160 may be utilized.

The SOC 100 may include multiple processing units, ASICs and other processing blocks. Other processor cores on SOC 100 may not include a mirrored silicon image of processors 130a-130d. These other processing blocks may have a micro-architecture different from the micro-architecture used by the processors 130a-130d. For example, a micro-architecture that provides high instruction throughput for a computational intensive task. Processor core 172 may have a parallel architecture. For example, other processors may include a single instruction multiple data (SIMD) core. Examples of SIMD cores include graphics processing units (GPUs), digital signal processing (DSP) cores, or other. For example, the video graphics controller 120 may include one or more GPUs for rendering graphics for games, user interface (UI) effects, and other applications.

The display controller 124 may include analog and digital blocks and digital-to-analog converters (DACs) for bridging internal blocks to external display physical blocks. The units 122 may group processing blocks associated with real-time memory performance for display and camera subsystems. The units 122 may in clued image blender capability and other camera image processing capabilities as is well known in the art. The units 122 may include display pipelines coupled to the display controller 124.

The units 126 may group processing blocks associated with non-real-time memory performance for image scaling, rotating, and color space conversion, accelerated video decoding for encoded movies, audio processing and so forth. The units 122 and 126 may include analog and digital encoders, decoders, and other signal processing blocks. The I/O interface ports 170 may include interfaces well known in the art for one or more of a general-purpose I/O (GPIO), a universal serial bus (USB), a universal asynchronous receiver/transmitter (uART), a FireWire interface, an Ethernet interface, an analog-to-digital converter (ADC), a DAC, and so forth.

Figure 2:
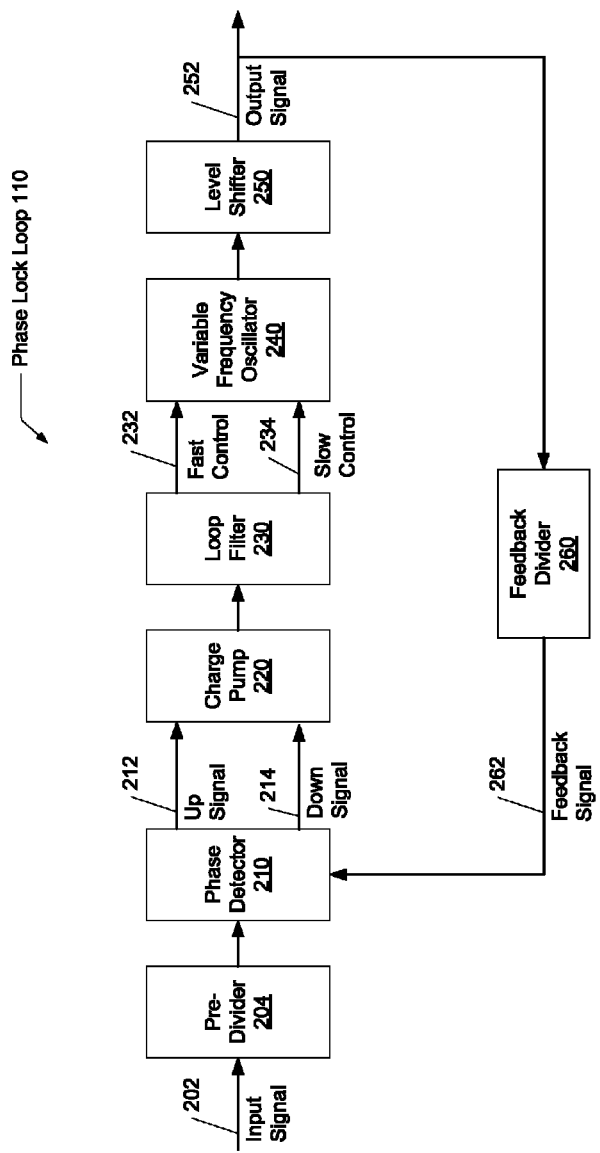
FIG. 2 is a generalized block diagram of one embodiment of a phase locked loop (PLL).

Turning now to FIG. 2, one embodiment of a generalized block diagram of a phase lock loop 110 is shown. As shown, the phase lock loop (PLL) 110 may utilize a negative feedback closed-loop configuration. An input signal 202 may be a periodic clock signal generated off chip to be used as a reference clock signal with a reference phase and a reference frequency. A pre-divider 204 may receive the input signal 202. The phase detector 210 may receive the output of the pre-divider 204. In other embodiments, a pre-divider 204 may not be used. The phase detector 210 may also receive a feedback signal 262 to compare to the input signal 202 or to the output of the pre-divider 204.

In one embodiment, the feedback signal 262 is a divided version of a local generated signal, such as the output signal 252. In another embodiment, the feedback signal 262 is a divided version of a distributed signal derived from the output signal 252. In one embodiment, a frequency divider 260 generates the feedback signal 262. In other embodiments, a frequency divider located outside of the PLL 110 is used. Alternatively, no frequency divider is used. One or more frequency dividers may be used to provide the output frequency of the output signal 252 as a rational multiple of the input frequency of the input signal 202. A post-divider (not shown) may be used to generate an output clock signal for the PLL 110. Similar to the feedback divider 260, this post-divider may receive the output signal 252 and have a different integer divisor value than the feedback divider 260. In one example, no post-divider is used and the input frequency may be multiplied by a ratio of an integer divisor value for the feedback divider 260 (integer B) to an integer divisor value for the pre-divider 204 (integer A) to generate the output frequency of the output signal 252. In other words, $\text{frequency}_{output} = \text{frequency}_{input} \times (B/A)$. In other examples, a post-divider is used and the output frequency is a function of an integer divisor value for the post-divider (integer C) and the integers A and B.

The phase detector 210 compares the input signal 202 or the output of the pre-divider 204 and the feedback signal 262. Based on the comparison, the phase detector 210 generates one or more control signals, such as the up signal 212 and the down signal 214. The magnitude of these signals may be proportional to a measured phase difference. The control signals 212 and 214 are conveyed to a charge pump 220, which provides a current output to control the charge stored in the loop filter 230. Therefore, the control signals 212 and 214 are converted to analog voltage signals. The loop filter 230 filters out higher frequencies, glitches, spurious noise, and reference spurs from the current output signal conveyed from the charge pump 220. The direct current (dc) component of generated voltage control signals 232 and 234 are provided to the oscillator 240. The filtering out of higher frequencies and noise may reduce jitter in the output signal 252.

The loop filter may convey two voltage control signals, fast control 232 and slow control 234, to the variable frequency oscillator 240. In one embodiment, the loop filter 230 is a dual-path low-pass filter. A dual-path configuration may provide flexibility in choosing loop parameters to optimize tracking changes in the reference signal 202. The dual-path low-pass filter design may support loop bandwidth adjustment by controlling gain in the slow control path and supports reduction of a damping factor by controlling gain in the fast control path. During the lock-in process, the time constants associated with the slow control path within the loop filter 230 may determine the duration of the lock time of the PLL 110.

The oscillator 240 may be configured to generate the output signal 252 with a variable frequency. An optional level shifter 250 may be used to provide a full supply voltage swing of the output clock signal 252. The oscillator 240 may be a voltage-controlled oscillator (VCO). The voltage control signals, 232 and 234, conveyed from the loop filter 230 to the oscillator 240 may increase or decrease in response to a measured phase difference by the phase detector 210. The changes in the voltage control signals 232 and 234 may cause the oscillator 240 to speed up or slow down in an attempt to match the input frequency of the input signal 202.

When the difference in phases and/or frequencies between the output signal 252, or alternatively the feedback signal 262, and the input signal 202 is within a given tolerance, then the output signal 252 is locked on the input signal 202. The phase lock loop 110 may convey an indication of this lock to a state machine. The state machine may store a state indicating a lock state. Each of the PLLs 110a-110g may have a state machine that controls proper sequencing of PLL controls to start and stop an associated PLL. In addition, the PLL 110 may provide an external bypass output signal in order to isolate the PLL and provide a stable clock during reset and configuration changes.

Figure 3:
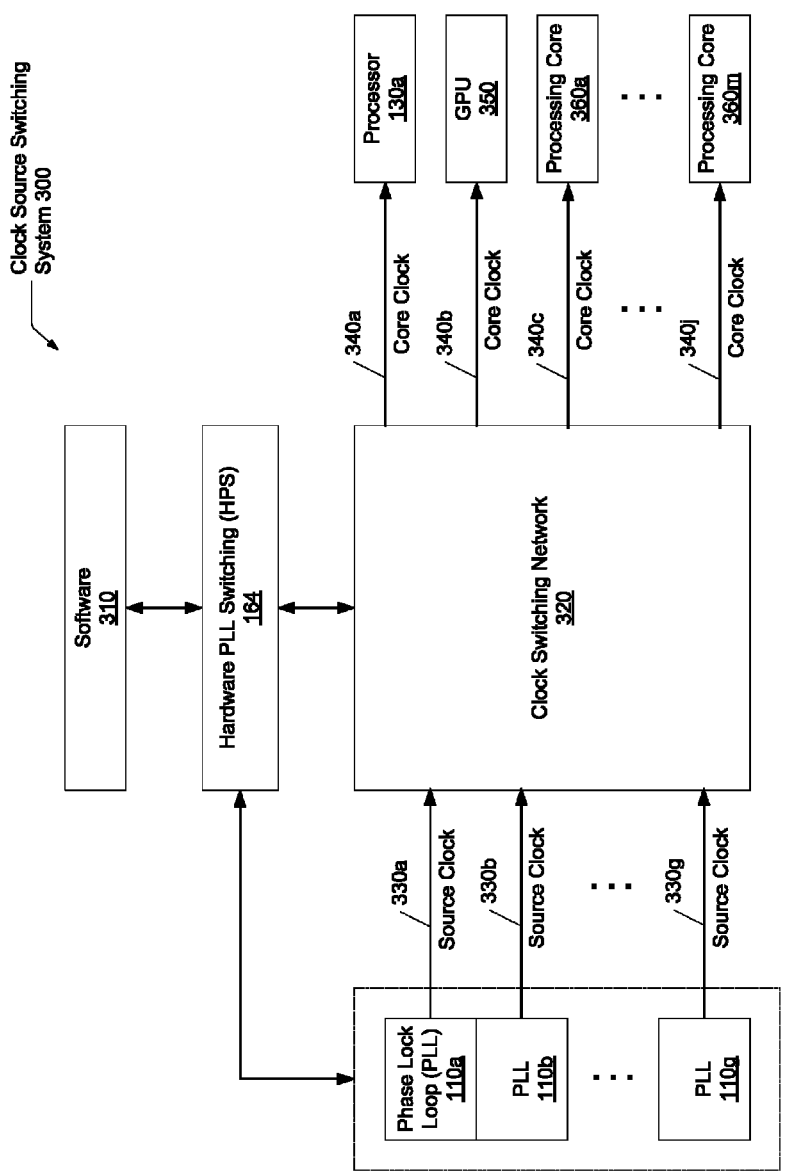
FIG. 3 is a generalized block diagram illustrating one embodiment of a clock source switching system.

Turning now to FIG. 3, a generalized block diagram illustrating one embodiment of a clock source switching system 300 is shown. The switching system 300 may include software 310, which communicates with the HPS 164 on the SOC 100. The software 310 may be one or more computer programs stored both in a kernel of an operating system (OS) and in a memory accessed by one or more of the processors 130a-130d. Each of the PLLs 110a-110g may provide a respective one of the source clocks 330a-330g.

The functional devices on the SOC 100 may be represented by processor 130a, a graphics processing unit (GPU) 350, and processing cores 360a-360m. Each of the processors 130b-130d is not shown for ease of illustration. Although a single GPU is shown, one or more of the processing cores 360a-360m may include a GPU. Each of the processing cores 360a-360m represent possible functional devices located on the SOC 100 and receiving a respective one of the core clocks 340a-340j. In addition, one or more memories and buses may have a separate generated core clock. Alternatively, a given bus or memory may utilize one of the core clocks 340a-340j.

In one embodiment, each of the core clocks 340a-340j is a different core clock routed on the SOC 100 as an output of the clock switching network 320. In another embodiment, one or more of the core clocks 340a-340j is a same core clock as another routed on the SOC 100 as an output of the clock switching network 320. In other words, two or more of the processor 130a, the GPU 350 and the processing cores 360a-360m may receive a same clock signal.

The clock switching network 320 may connect each one of the core clocks 340a-340j to a respective one of the source clocks 330a-330g. The clock switching network 320 may include one or more clock buffers, gated clock buffers that receive a clock enable signal, glitchless clock switching circuits such as glitchless multiplexers (MUXes), clock dividers and so forth.

In one embodiment, the software 310 may send a valid request signal to indicate an incoming request and associated PLL switching request information. The PLL switching request information may include a clock destination number or identifier that identifies one of the core clocks 340a-340j, PLL information to be loaded into one of the PLLs 110a-110g, and a method number identifying a method for selecting one of the PLLs 110a-110g. In one embodiment, the PLL information includes divisor values, such as at least a pre-divider integer value and a feedback divider integer value. In response to receiving this information from the software 310 and finding a target PLL within the PLLs 110a-110g, the HPS 164 may disable a current PLL that is providing the identified one of the core clocks 340a-340j. Additionally, the HPS 164 may enable and/or load new PLL information into the target PLL.

The HPS 164 may change selection values, connections and divisor values within the clock switching network 320. These changes may disconnect the request-identified one of the core clocks 340a-340j from the current one of the PLLs 110a-110g and reconnect it to a different one of the PLLs 110a-110g. The PLL switching performed by these steps may reduce a number of enabled PLLs on the SOC 100. Additionally, the PLL switching may change a clock frequency of one of the source clocks 330a-330g, the core clocks 340a-340j and/or the generated clocks within the clock switching network 320. In other embodiments, the HPS 164 may indicate to the software 310 to perform the reconnection steps and frequency changes. In yet other embodiments, the software 310 may wait for a done or finish indication from the HPS 164 that identifies a target PLL is found and its associated ID before performing the reconnection and frequency change steps.

Figure 4:
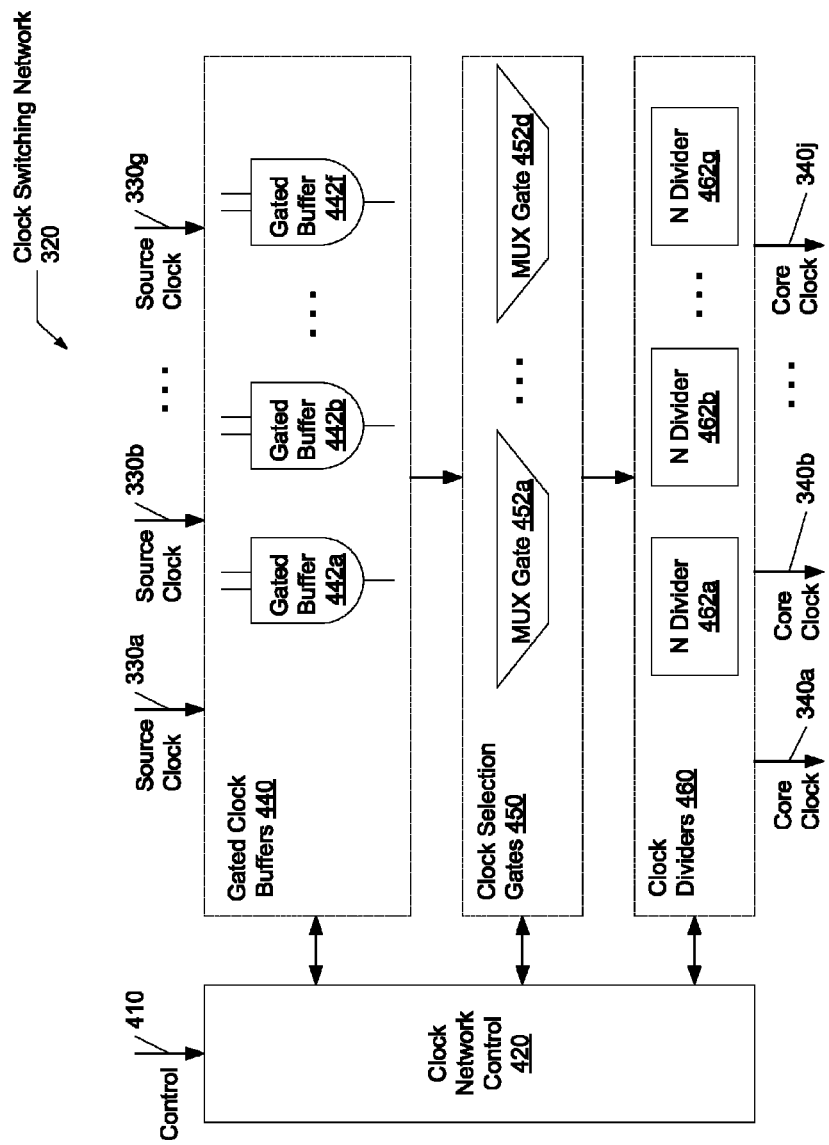
FIG. 4 is a generalized block diagram illustrating one embodiment of a clock switching network.

Turning now to FIG. 4, a generalized block diagram of one embodiment of a clock switching network 320 on a SOC is shown. In the illustrated embodiment, the network 320 includes gated clock buffers 440, clock selection gates 450 and clock dividers 460. Although the buffers and gates and dividers in the network 320 are shown in this particular order, other combinations are possible and contemplated. Further, other or additional circuitry and logic gates may be utilized as well. The arrangement and placement of the circuitry 440-460 may be set across the die of the SOC 100 in a manner that designers determine provides good design trade-offs.

In addition, the network 320 may include control logic in clock network control 420, which is coupled to each one of the circuitry gates 440-460. The clock network control 420 may provide control signals to the circuitry gates 440-460. The clock network control 420 may include multiple configuration registers and power state registers that may be updated by software or hardware. The control 410 may be provided by either software or hardware. The control 410 may update the contents of the configuration registers and power state registers based on control logic within the clock network control 420.

The gated clock buffers 440 may include the gated clock buffers 442a-442f. The gated clock buffers 442a-442f may receive the source clocks 330a-330g provided by the PLLs 110a-110g. Each of the gated clock buffers 442a-442f may receive a clock enable signal. In one embodiment, when the received clock enable signal is asserted, each associated one of the gated clock buffers 442a-442f provides a received clock signal on its output. Otherwise, a binary logic low value may be provided on the associated output. The gated clock buffers 442a-442f may be enabled and disabled as processing cores are turned on and off across the die of the SOC 100 and according to power domain management schemes. The clock enable signals may be asserted and deasserted by at least the clock network control 420.

The clock selection gates 450 may include the MUX gates 452a-452d. These gates may receive one or more clock select input signals from the clock network control 420. These select input signals may be used to determine which one of two or more clock input signals are to be placed on an associated output line. The clock select input signals and the multiple clock input signals might be asynchronous with respect to each other. However, the clock select input signals may not change until the multiple clock input signals have settled. In one embodiment, each of the MUX gates 452a-452f is a glitchless clock MUX gate. As is well known in the art, a glitchless clock MUX gate is typically used for clock selection on a given line while preventing an occurrence of glitching on the given line. Circuit techniques may be used to prevent any glitches on an output line although the received clock lines may be asynchronous and switching delays from one clock source to another clock source may be short.

The clock dividers 460 may include N dividers 462a-462g. The clock N dividers 462a-462g are frequency dividers that generate an output signal with an output frequency that is a divided version of an input frequency of a received input signal. The divided value is represented as the integer N.

In addition, one or more of the N dividers may be a fractional-N frequency synthesizer that is constructed using two integer N dividers. For example, a first divider may be a divide-by-N frequency divider and a second divider may be a divide-by-(N+1) frequency divider. With a modulus controller, an output division value may be toggled between the two integer values N and N+1 in order that an associated oscillator alternates between the two locked frequencies. The oscillator may stabilize at an output frequency that is a time average of the two locked frequencies. Further, the N dividers 460 may include one or more clock doublers. A clock doubler may create an output signal with two pulses for each received input pulse. A clock doubler may include pulse-width varying circuitry and voltage level comparators. Similar to the clock enables provided to the gated clock buffers 440 and the clock select input signals provided to the clock selection gates 450, divisor values may be provided to the clock dividers 460 by the clock network control 420.

Figure 5:
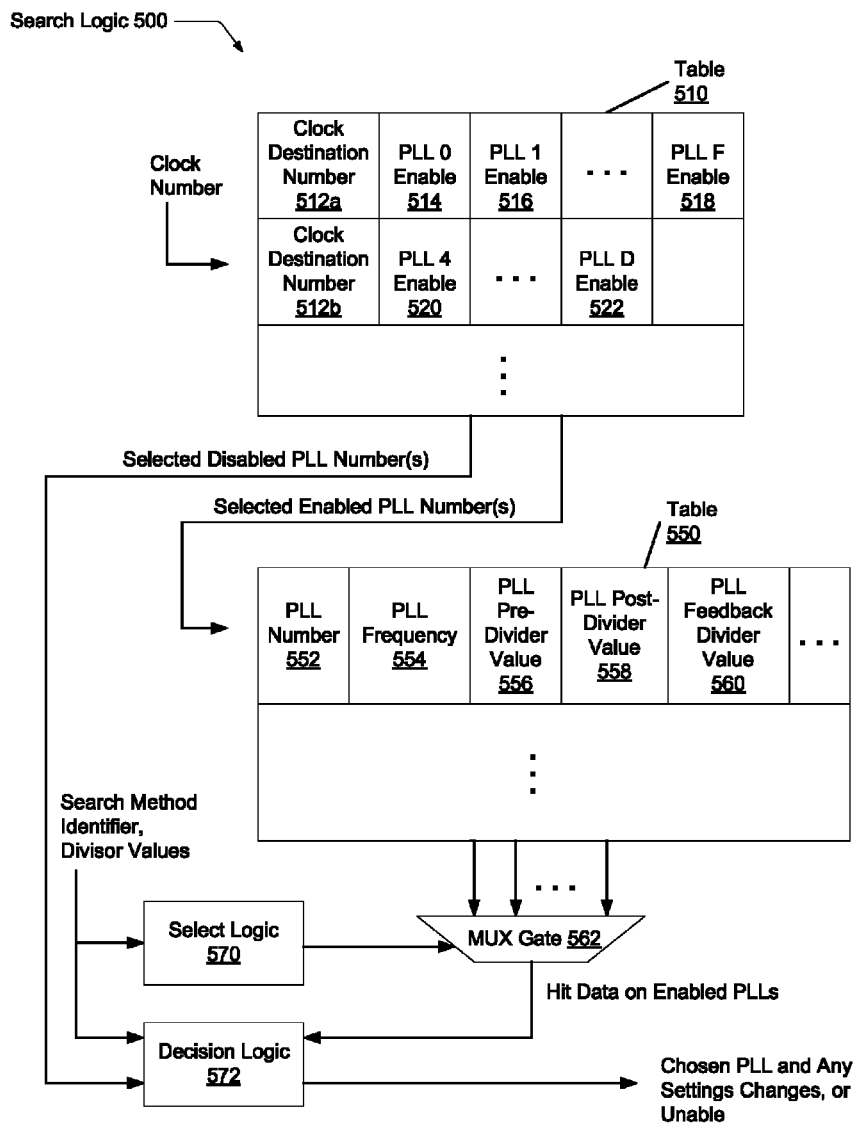
FIG. 5 is a generalized block diagram illustrating one embodiment of search logic for finding a given one of multiple PLLs for connection to a core clock.

Referring now to FIG. 5, a generalized block diagram illustrating one embodiment of search logic 500 for finding a given one of the PLLs 100a-110g for reconnection is shown. As described earlier, the HPS 164 may handle the procedures for performing a PLL switch. The software 310 may issue a PLL switch operation to be performed. This operation may identify one of the core clocks 340a-340j to be switched. In addition, the software 310 may identify one of the PLLs 110a-110g to be a target PLL. The target PLL may be the PLL used to provide an associated one of the source clocks 330a-330g, which is used by the clock switching network 320 to provide the identified one of the core clocks 340a-340j. Alternatively, the software 310 may identify to the HPS 164 a method for searching for a targeted PLL from the PLLs 110a-110g.

The search logic 500 may be included in the HPS 164. A clock number may be provided by the software 310 and may identify one of the core clocks 340a-340j. This value may be used to index a table 510. Each entry of the table 510 may include a clock destination number 512 that identifies a given one of the core clocks 340a-340j.

Each entry may also include an enable field for each one of the PLLs 110a-110g that may be a candidate to provide the given one of the core clocks 340a-340j identified by the clock destination number 512. For example, the first entry shown in the illustrated embodiment has fields 514-518, which show whether or not each of the PLL candidates for the core clock identified by the destination number 512a is enabled. The PLL candidates may be already known and the position of the field within the entry may be used to identify a given PLL within a group of candidates.

The second entry shown has fields 520-522, which show whether or not each of the PLL candidates for the core clock identified by the destination number 512b is enabled. Each entry may have a different number of fields, since each one of the core clocks 340a-340j may have a different number of PLL candidates that may be used to generate it via the clock switching network 320. In one embodiment, a first set of identified enabled PLLs and a second set of identified disabled PLLs may be read from table 510. The first set of identified enabled PLLs may be used to index the table 550. The second set of identified disabled PLLs may be sent to decision logic 572.

As shown, an entry in the table 550 may include a PLL number 552, a PLL frequency 554, and PLL divisor values. The PLL divisor values may include a pre-divider integer value 556, a feedback divider integer value 558 and a post-divider integer value 560. Other PLL values may be stored in each entry of the table 550, such as a preferred lock time. One or more PLL identifiers and associated PLL values may be read from table 550 and sent to a MUX gate 562. The MUX gate 562 may be one or more mux gates used to select one or more of the values read from table 550 to be used in the decision logic 572. The select logic 570 may be used to determine this selection process.

At least a search method identifier from software 310 may be used to determine the selection. For example, if a given one of the PLL candidates is specified by the software 310 as a target PLL, then the associated divisor values and other PLL information may be selected by the MUX gate 562 and sent to the decision logic 572. If a target PLL is not identified by the software 310, then the software 310 may provide a search method identifier and PLL information, such as divisor values, a lock time and other, to the decision logic 572.

The decision logic 572 may receive PLL values from the tables 510 and 550 corresponding to multiple PLLs that may be candidates to supply the identified core clock. One of the disabled PLLs may be selected, have preferred PLL information loaded into it and be enabled if selected by the decision logic 572. The manner the decision logic 572 selects a given one of the candidate PLLs may be determined by the search method identifier received from the software 310. A further description of the PLL search is provided below.

Referring now to FIG. 6, a generalized block diagram illustrating one embodiment of a PLL search state table 600 is shown. In one embodiment, the steps included in the table 600 may be implemented as a state machine with control logic. A PLL search method identifier (ID) may be provided by the software 310. This PLL search method ID may be used to index the table 600 and compared to the values in the field 610 of the table 600. Steps of a given search method are briefly described in field 620 of table 600. These steps may be implemented by comparison logic and accessing other tables, such as a table that identifies a subset of PLLs of the PLLs 100a-100g that are able to provide a given one of the core clocks 340a-340j.

As shown in table 600, for a method 0, the software 310 provides to the HPS 164 an identified one of the core clocks 340a-340j to be switched from a current PLL to a different PLL of the PLLs 100a-100g. The settings of an identified different PLL may not be changed. Connecting the identified core clock to the identified PLL may include changing settings within the clock switching network 320. A step including a disconnection from a current PLL and a reconnection to the different identified PLL may include changing values on the clock select input lines to the clock selection gates 450. In addition, this step may include changing values on the N divisor values to the clock dividers 460 and clock enable inputs to the gated clock buffers 440. If the identified different PLL to be used for reconnection is disabled, then a status of the disabled PLL may be sent to the software 310 with no reconnection performed. Alternatively, if the request allows the PLL to be enabled, then the HPS 164 may enable this PLL, the reconnection steps are performed, and the HPS 164 notifies the software 310 of the enable step.

As shown in table 600, for a method 1, the software 310 provides an identified one of the core clocks 340a-340j to be switched from a current PLL to a different PLL of the PLLs 100a-100g. The settings of an identified different PLL may be changed by the HPS 164 to request-identified settings provided by the software 310. These settings may include a pre-divider value, a feedback divider value, a post-divider value, a preferred lock time, and so forth. The disconnection and reconnection steps for the identified core clock may occur as described above including sending notifications to the software 310 of a disabled PLL. If the identified different PLL is used to provide other core clocks on the SOC 100, then a status of the used PLL may be sent to the software 310 with no reconnection performed. Alternatively, if the request allows the PLL to be used, then the HPS 164 may switch the identified core clock to this PLL, the reconnection steps are performed, and the HPS 164 notifies the software 310 of the in-use-by-others status.

For methods 2 to 5 in table 600, the software 310 may not identify a particular PLL to be used with an identified core clock. Therefore, the HPS 164 may identify a subset of PLLs within the PLLs 100a-100g that are able to provide the identified core clock. For example, there may not be a path through the clock switching network 320 to a request-identified core clock from each one of the PLLs 100a-100g.

For method 2 in table 600, the HPS 164 may identify a PLL that currently provides the request-identified core clock. Then the HPS 164 may identify an enabled PLL next to the identified PLL within an associated subset. Identifying a next enabled PLL may include traversing a given list of PLL IDs associated with the subset in a given order. For example, a subset may include PLL IDs 1 to 4. A currently used PLL for a request-identified core clock may be identified with an ID 2. An ascending order for a search may be used. If the PLL identified by ID 3 is disabled, but a PLL identified by ID 4 is enabled, then the "next PLL" may be identified by ID 4.

If this "next PLL" is enabled, but does not currently provide any core clocks on the SOC 100, then this "next PLL" may be chosen as a target PLL. If this next PLL does not meet these conditions, then a PLL next to this "next PLL" may be identified and the comparisons and search continues. The settings of the found target PLL may be changed by the HPS 164 to request-identified settings provided by the software 310. The disconnection and reconnection steps for the identified core clock may occur as described above. If a target PLL is not found, then a status of the failed search may be sent to the software 310.

For method 3 in table 600, the HPS 164 may perform similar steps as for method 2, but search for a next disabled PLL within a subset, rather than a next enabled PLL. For each of methods 4 and 5 in table 600, the HPS 164 may search enabled PLLs in an associated subset without following a given order. If an enabled PLL within the subset has PLL settings matching the request-specified settings and the enable PLL is not currently in use by other core clocks, then this enabled PLL may be selected as the target PLL. The steps for the disconnection from the current PLL and the reconnection steps to the target PLL for the identified core clock may occur as described above.

For methods 4 and 5, if no enabled PLL satisfies the given conditions, then an associated status may be sent to the software 310. In addition, the search may continue with one of the above methods, such as method 2 or method 3.

Figure 7:
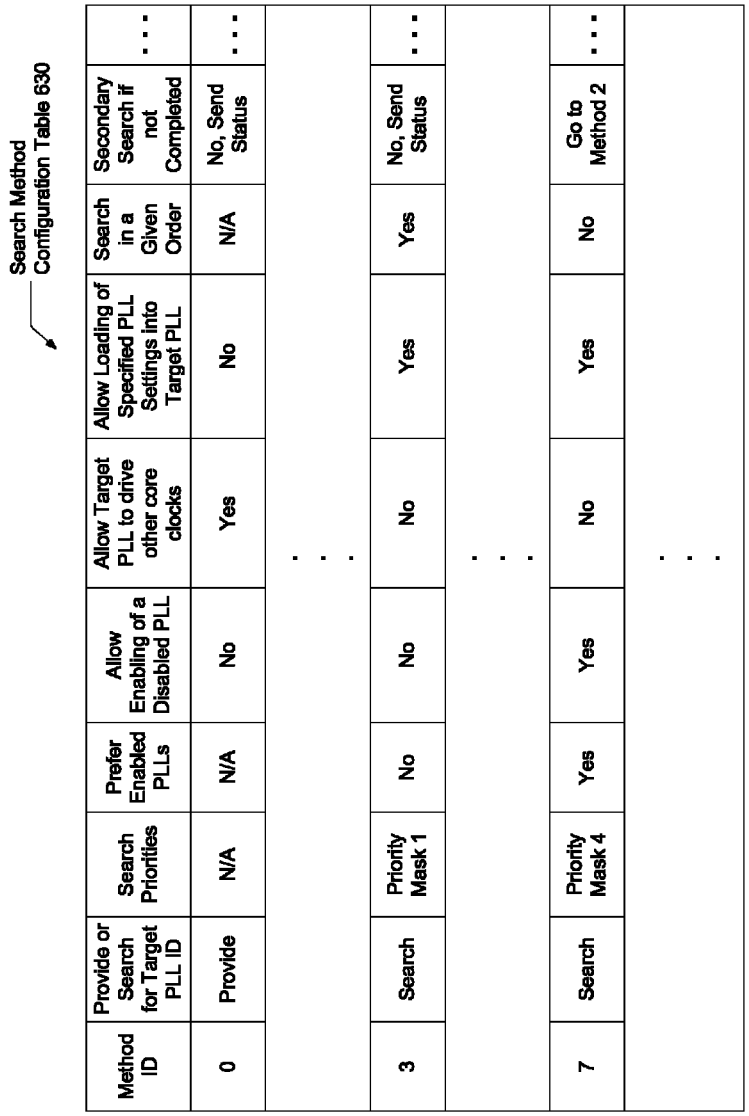
FIG. 7 is a generalized block diagram illustrating one embodiment of a PLL search method configuration table.

Turning now to FIG. 7, a generalized block diagram illustrating one embodiment of a PLL search method configuration table 630 is shown. Each entry of the table 630 may include multiple fields that define characteristics of a search method. For example, an identifier (ID) may be used to indicate a given method. This identifier may be sent from the software 310 to the HPS 164.

In response to receiving a valid indication of a PLL switch request and the search method ID, the HPS 164 may follow the steps of a search for a target PLL as defined with the fields of the configuration table 630. In one embodiment, a search request method may be characterized by whether it provides a target PLL ID or indicates a search. In addition, the method may be characterized by whether a search request from the software 310 prefers enabled PLLs over enabling a disabled PLL, allows enabling a disabled PLL, allows a target PLL to provide a source clock used to derive multiple core clocks, and allow loading of request-specified PLL settings into a target PLL. Other characteristics may include at least searching for a target PLL in a particular order and, if a target PLL is not found with the current search method, continuing the search with a different search method with different characteristics. The HPS 164 may utilize indexed tables, configuration registers and combinatorial logic to implement the search method characteristics indicated in table 630.

Figure 8:
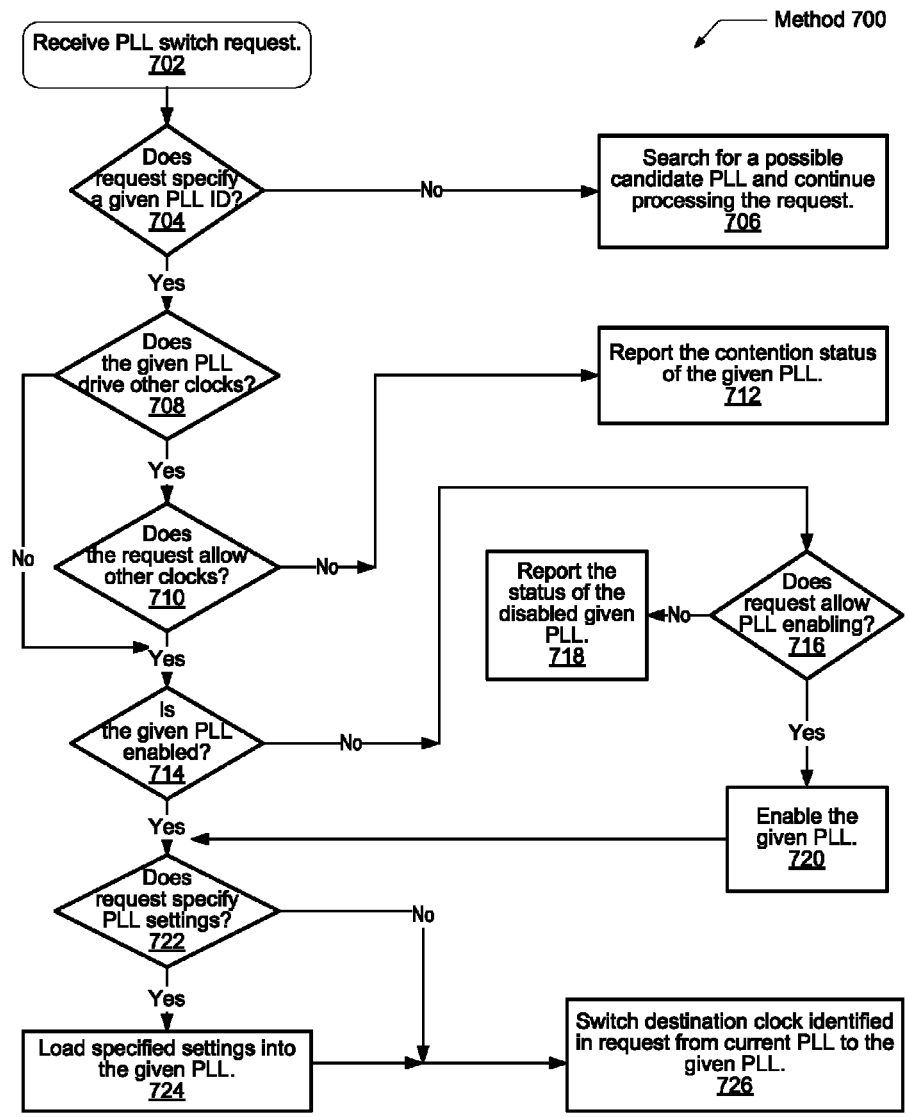
FIG. 8 is a generalized flow diagram illustrating one embodiment of a method for connecting a specified PLL as a target PLL to an identified core clock.

Referring now to FIG. 8, a generalized flow diagram illustrating one embodiment of a method 700 for connecting a specified PLL as a target PLL to an identified core clock is shown. For purposes of discussion, the steps in this embodiment are shown in sequential order. However, some steps may occur in a different order than shown, some steps may be performed concurrently, some steps may be combined with other steps, and some steps may be absent in another embodiment.

In block 702, the HPS 164 may receive a PLL switch request from the software 310. If the request does not specify a given PLL identifier (conditional block 704), then in block 706, a search may be performed for a possible candidate PLL. This search may be described further in method 700 below. If the request does specify an identifier of a given one of the PLLs 110a-110g (conditional block 704) and the identified PLL drives one or more other clocks of the core clocks 340a-340j besides the identified core clock (conditional block 708), then a check is made whether the request allows this condition. If the search method identified in the request sent from the software 310 does not allow the target PLL to provide other clocks (conditional block 710), then in block 712, the contention status may be reported by the HPS 164 to the software 310.

If the search method identified in the request sent from the software 310 does allow the target PLL to provide other clocks (conditional block 710) and the identified PLL is disabled (conditional block 714), then a check is made whether the request allows enabling of a PLL. If the search method identified in the request sent from the software 310 does not allow the HPS 164 to enable PLLs (conditional block 716), then in block 718, the disabled PLL status may be reported by the HPS 164 to the software 310. If the identified search method does allow the HPS 164 to enable PLLs (conditional block 716), then in block 720, the given PLL may be enabled. A bypass signal may be used on an output line of the given PLL in the meantime until the given PLL locks. In another embodiment, PLL settings may be loaded prior to any enabling step.

If the identified search method specifies PLL settings (conditional block 722), then in block 724, the HPS 164 loads the specified settings into the given PLL. In one embodiment, the HPS 164 writes a preferred lock time into a parameter register and PLL divisor values into configuration registers. Then a load input line is asserted. The HPS 164 may then wait and poll a given PLL control register that indicates when the PLL has reached a lock state.

In block 726, settings within the clock switching network 320 may be changed in order to disconnect the identified core clock from a current PLL and reconnect the identified core clock to the given PLL, which is the target PLL. As described earlier, one of multiple methods may be used to perform these actions. In one embodiment, the HPS 164 provides notification to the software 310 that a target PLL is found and its associated PLL ID. In response, the software 310 may send parameter values and control signals to perform the disconnect and reconnect steps. In another embodiment, the software 310 may send the parameter values and the control signals with the PLL switch request, since the software 310 identifies the target PLL in this case.

Figure 9:
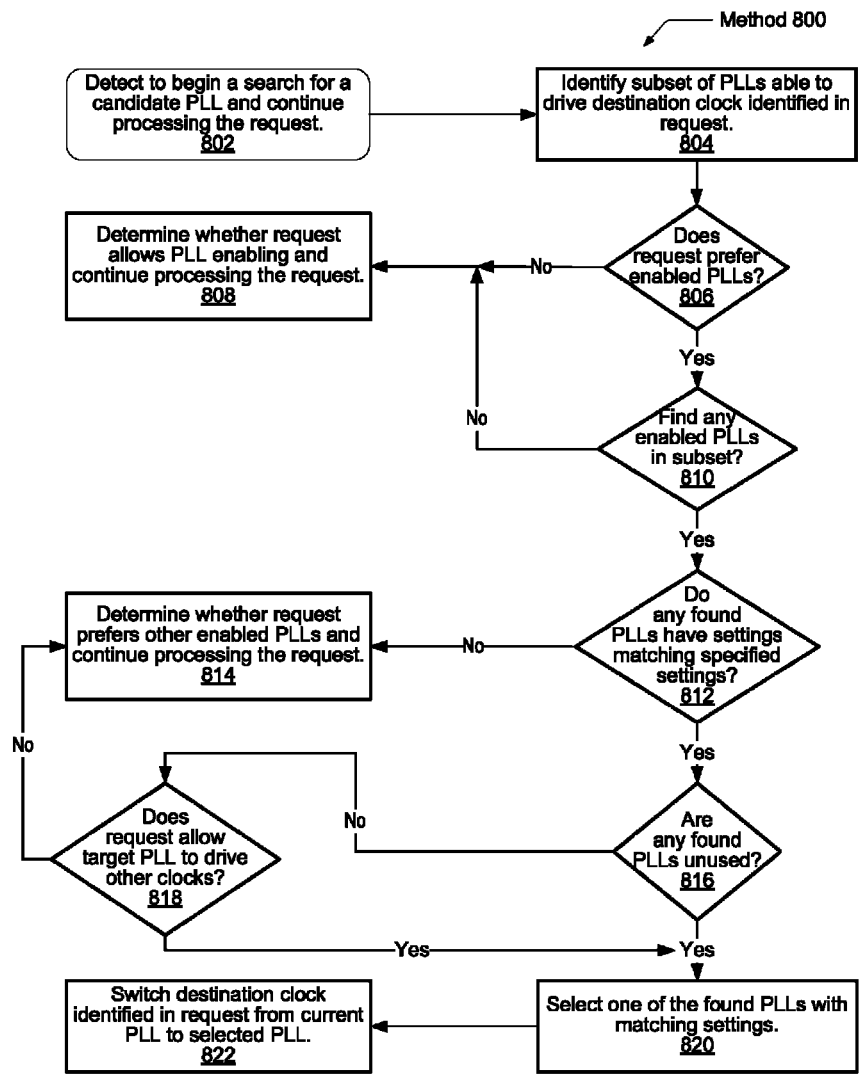
FIG. 9 is a generalized flow diagram illustrating one embodiment of a method for searching for a given one of multiple PLL candidates for providing an identified core clock.

Referring now to FIG. 9, a generalized flow diagram illustrating one embodiment of a method 800 for searching for a given one of multiple PLL candidates for providing an identified core clock is shown. For purposes of discussion, the steps in this embodiment are shown in sequential order. However, some steps may occur in a different order than shown, some steps may be performed concurrently, some steps may be combined with other steps, and some steps may be absent in another embodiment.

In block 802, a PLL switch request from the software 310 is received and a given target PLL is not specified. This step may be a continuation from block 706 in method 700. As described earlier, in block 804, the HPS 164 may identify a subset of PLLs within the PLLs 100a-100g that are able to provide the identified core clock. If the search request does not prefer to use enabled PLLs as a found target PLL (conditional block 806), then in block 808, a check is made whether the search allows the HW PLL switching control 164 to enable a PLL and the search continues. Further details of the continue search are provided shortly regarding method 900 below. If the search request does prefer to use enabled PLLs as a found target PLL (conditional block 806), and one or more enabled PLLs are found in the subset (conditional block 810), then a check is made whether any of these found enabled PLLs have PLL settings matching request-specified PLL settings. Otherwise, if no enabled PLLs are found in the subset (conditional block 810), then control flow of method 800 moves to block 808.

If any of the found enabled PLLs within the subset have PLL settings matching the request-specified PLL settings (conditional block 812), but none of these settings-matching PLLs are unused, or provide no core clocks (conditional block 816), then a check is made whether the request allows a target PLL to provide other core clocks. If the search request does not allow a target PLL to provide other core clocks (conditional block 818), then in block 814, a check is made whether the request prefers to use other enabled PLLs, such as PLLs without matching settings is performed. Then the search process continues. Further details of the continued search are provided below in method 900. If none of the found enabled PLLs within the subset have PLL settings matching the request-specified PLL settings (conditional block 812), then control flow of method 800 moves to block 814, which is further described in method 900.

If the search request does allow a target PLL to provide other core clocks (conditional block 818), then control flow of method 800 moves to block 820. Similarly, if one or more of the found settings-matching PLLs are unused, or do not provide a core clock (conditional block 816), then in block 820, one of these settings-matching PLLs is selected as the target PLL. Similar to the block 726 in method 700, in block 822, settings within the clock switching network 320 may be changed in order to disconnect the identified core clock from a current PLL and reconnect the identified core clock to the given PLL, which is the target PLL.

A difference between block 726 of method 700 and block 822 of method 800 is the software 310 identified the target PLL in method 700. In block 822, the target PLL selected by the hardware PLL switching control 164 is still unknown to the software 310. Therefore, in one embodiment, the HPS 164 may send a notification to the software 310 that a target PLL is found and its associated PLL ID. In response, the software 310 may send parameter values and control signals to perform the disconnect and reconnect steps. In another embodiment, the PLL settings of the target PLL may match the request-identified PLL settings. If this is the case, the parameter values and control signals for changing connections within the clock switching network 320 may be supplied within the PLL switch request. These values may be used to perform the change at this time without a subsequent handshaking protocol with the software 310.

Figure 10:
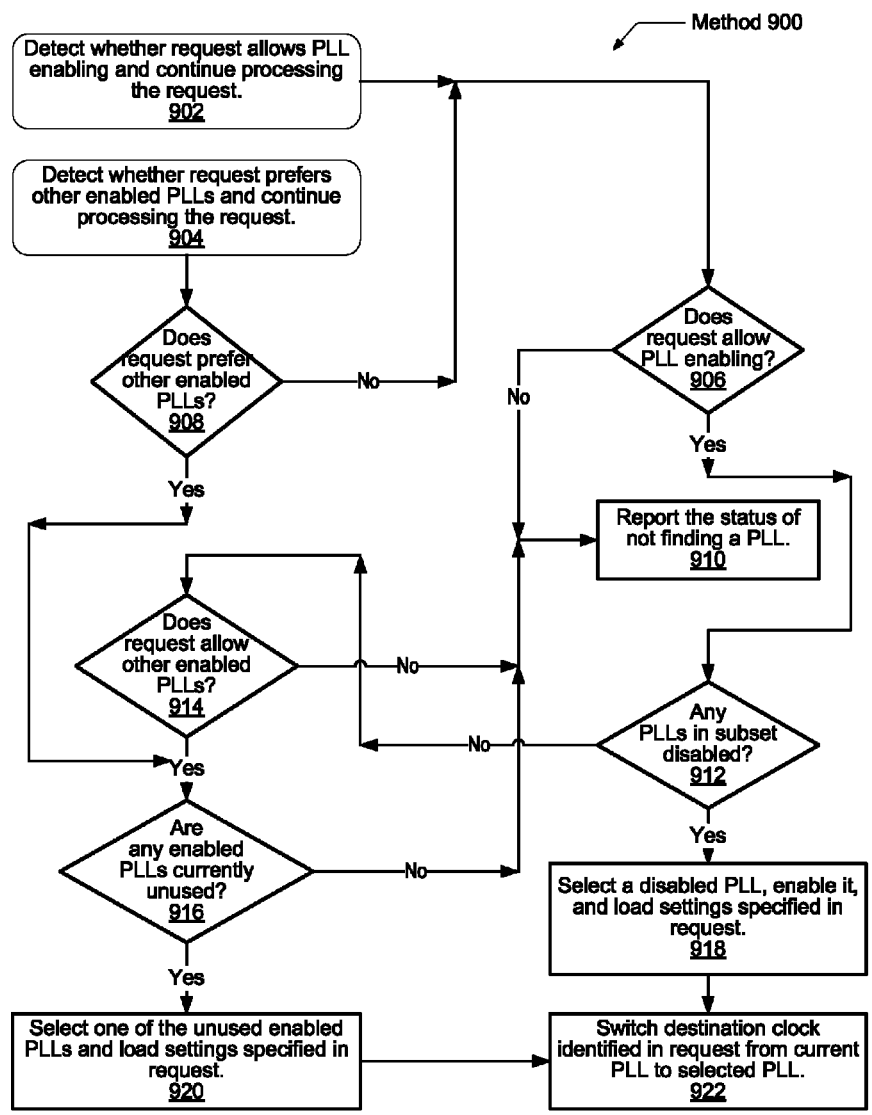
FIG. 10 is a generalized flow diagram illustrating one embodiment of a method for continuing to search for a given one of multiple PLL candidates for providing an identified core clock.

Referring now to FIG. 10, a generalized flow diagram illustrating one embodiment of a method 900 for continuing to search for a given one of multiple PLL candidates for providing an identified core clock is shown. For purposes of discussion, the steps in this embodiment are shown in sequential order. However, some steps may occur in a different order than shown, some steps may be performed concurrently, some steps may be combined with other steps, and some steps may be absent in another embodiment.

In block 902, the HW PLL switching control 164 detects whether the received request from the software 310 allows a disabled PLL to be enabled. This step may be a continuation of the block 808 in method 800. If the request does not allow a PLL to be enabled (conditional block 906), then in block 910, the status of not finding a target PLL and additional search result information may be sent to the software 310. If the request does allow a PLL to be enabled (conditional block 906) and one or more disabled PLLs are detected in the subset (conditional block 912), then in block 918, one of the disabled PLLs is selected as the target PLL and enabled. A bypass signal may be used on an output line of the target PLL in the meantime until the target PLL locks. In another embodiment, the PLL settings may be loaded prior to any enabling step.

Continuing with the block 918 of method 900, the HW PLL switching control 164 loads the specified settings into the target PLL. In one embodiment, the HW PLL switching control 164 writes a preferred lock time into a parameter register and PLL divisor values into configuration registers. Then a load input line is asserted. The HW PLL switching control 164 may then wait and poll a given PLL control register that indicates when the PLL has reached a lock state. Similar to blocks 726 and 822 of methods 700 and 800 described above, in block 922, settings within the clock switching network 320 may be changed in order to disconnect the identified core clock from a current PLL and reconnect the identified core clock to the target PLL. The examples described above regarding block 822 of method 800 may be used here, wherein the PLL target may still be unknown at this time to the software 310.

If no disabled PLLs are detected in the subset of PLL candidates (conditional block 912) and the received request does not allow other enabled PLLs to be selected as a target PLL (conditional block 914), then control flow of method 900 moves to block 910 and an associated status message is sent to the software 310 as described above. If the received request does allow other enabled PLLs to be selected as a target PLL (conditional block 914) and one or more of these PLLs are unused (conditional block 916), or do not drive any other core clocks, then in block 920, one of these unused and enabled PLLs is selected as the target PLL.

Similar to blocks 724 and 918, in block 920, the HW PLL switching control 164 may load request-specified PLL settings into the target PLL. However, in block 724, the PLL ID is specified by the request. In block 918, the selected target PLL was previously disabled. Here, in block 920, the selected target PLL is previously enabled and previously unknown as the target PLL to the software 310. In addition, in block 920, the selected target PLL is unused, or it does not current provide any one of the core clocks 340a-340j on the SOC 100. Therefore, it may be considered safe to load the request-specified settings into the selected PLL. After block 920, the control flow of method 900 moves to block 922, which is described above.

If enabled PLLs are allowed to be selected (conditional block 914) and each of these enabled PLLs is used and provides one or more of the core clocks 340a-340j (conditional block 916), then in block 910, a message may be sent to the software 310. This message may include the search status and indicate possible PLL IDs for selection. Then the software 310 may determine which PLL ID to use as a target PLL and send a subsequent PLL switch request that identifies a particular PLL. This subsequent request would follow the blocks 702, 704 and 708-724 in method 700.

In block 904, the HW PLL switching control 164 detects whether the received request from the software 310 prefers a target PLL to be already enabled. This step may be a continuation of the block 814 in method 800. If the received search request from the software 310 does prefer a target PLL to be already enabled (conditional block 908), then method 900 moves to conditional block 916. Otherwise, method 900 moves to conditional block 906. Both conditional blocks 906 and 916 are described above.

It is noted for methods 700-900, additional steps may be added. One example is a check for whether the received request allows a currently used PLL that already provides one or more core clocks to be selected if the test in the conditional block 916 fails. A second example is a counter may be used by HPS 164 that measures a time duration for a PLL search. If the timer saturates, then the HPS 164 may stop its search and notify the software 310 of the timeout condition. Alternatively, the HPS 164 may notify the software 310 of the timeout condition, but continue the PLL search until the software 310 sends a message to stop searching. For each successful and unsuccessful PLL search performed by the HPS 164, an associated message may be sent to the software 310 including one or more of a successful/unsuccessful status, a found target PLL ID, an identified search step that found the target PLL, a number of enabled and disabled PLLs within an associated subset, a number of unused enabled PLLs, and so forth. In other embodiments, the HPS 164 may send one or more of this data to the software 310 as instructed, rather than at a time of a PLL search.

Other combinations of checks may be used within methods 700-900. In addition, the priorities of the checks may be changed. For example, a check for unused PLLs may occur prior to a check for a preference for already enabled PLLs. The tests, conditions and priorities may change on-the-fly as configuration registers are changed within the HW PLL switching control 164. Alternatively, search methods with set characteristics may be followed in lock step fashion once they are defined, such as in configuration table 630. The configuration table 630 may be used to define similar or different search methods as methods 700-900.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:
1. A method comprising:
providing via a clock switching network a plurality of core clocks;
receiving a software-initiated request specifying a phase lock loop (PLL) configuration for a first core clock of the plurality of core clocks;
searching via a hardware control block for a given PLL of a plurality of PLLs which satisfies the request; and
controlling the clock switching network to switch connection of the first core clock from a current PLL to the given PLL.

2. The method as recited in claim 1, further comprising the hardware control block identifying a subset of PLLs within the plurality of PLLs, wherein each PLL in the subset of PLLs is able to provide the first core clock.

3. The method as recited in claim 2, wherein in response to determining the request indicates an already enabled target PLL is preferred, the method further comprises the hardware control block searching any enabled PLLs within said subset that satisfy further conditions specified in the request.

4. The method as recited in claim 3, wherein in response to determining no enabled PLLs are in said subset and each enabled PLL does not have a same PLL setting as settings specified in the request, the method further comprises the hardware control block:

determining conditions indicated by the received request permit a disabled PLL to be enabled; and in response to said determining:
selecting a disabled PLL in said subset as the target PLL;
loading the PLL settings specified in the request into the target PLL; and
enabling the target PLL.

5. The method as recited in claim 2, wherein in response to determining one or more enabled PLLs are in said subset and have a same PLL setting as settings specified in the request, the method further comprises a hardware control block selecting an unused PLL as the target PLL.

6. The method as recited in claim 5, wherein in response to determining one or more enabled PLLs are in said subset and each enabled PLL does not have a same PLL setting as settings specified in the request, the method further comprises the hardware control block:
determining conditions indicated by the received request permit settings to be loaded into a target PLL; and
in response to said determining:
selecting one of the enabled PLLs in said subset as the target PLL; and
loading the PLL settings specified in the request into the target PLL.

7. The method as recited in claim 2, wherein in response to not finding the target PLL, the method further comprises the hardware control block searching again according to different conditions specified in another search method indicated by the request.

8. The method as recited in claim 2, wherein in response to not finding the target PLL after searching for the target PLL according to each search method indicated in the request, the method further comprises the hardware control block sending an associated message to software.

9. A system-on-a-chip (SOC) comprising:
a plurality of phase lock loops (PLLs);
a clock switching network; and
a hardware PLL switching (HPS) control block coupled to the clock switching network, wherein the HPS control block is configured to:
receive a software-initiated request specifying a phase lock loop (PLL) configuration for a first core clock of the plurality of core clocks;
search for a given one of a plurality of PLLs as a target PLL, wherein the target PLL satisfies conditions specified in the PLL configuration; and
configure the clock switching network to switch connection of the first core clock from a current PLL to the target PLL.

10. The SOC as recited in claim 9, wherein the HPS control block is further configured to identify a plurality of PLLs that are able to provide the first core clock.

11. The SOC as recited in claim 10, wherein in response to determining the request identifies a method which prefers an already enabled target PLL, the HPS control block is further configured to first search for any enabled PLLs that satisfy the request.

12. The SOC as recited in claim 11, wherein in response to determining there are no unused PLLs in said subset, the HPS control block is configured to select an unused PLL as the target PLL.

13. The SOC as recited in claim 11, wherein in response to determining one or more enabled PLLs are in said subset, the HPS control block is further configured to:

select one of the enabled PLLs in said subset as the target PLL; and
load the PLL settings specified in the request into the target PLL.

14. The SOC as recited in claim 11, wherein in response to determining no enabled PLLs are in said subset, the HPS control block is further configured to:
select a disabled PLL in said subset as the target PLL;
load the PLL settings specified in the request into the target PLL; and
enable the target PLL.

15. The SOC as recited in claim 10, wherein in response to not finding the target PLL, the HPS control block is configured to search again according to method indicated by the request.

16. The SOC as recited in claim 15, wherein in response to not finding the target PLL after searching again for the target PLL, the HPS control block is further configured to send an associated message to software via the software interface.

17. An apparatus comprising:
a plurality of tables storing information corresponding to operating characteristics of a plurality of phase lock loops (PLLs); and
control logic coupled to each of a first interface, a second interface and the plurality of tables, wherein the control logic is configured to:
receive via the first interface a software-initiated request specifying a phase lock loop (PLL) configuration for a first core clock of the plurality of core clocks;
search for a given one of a plurality of PLLs on the SOC as a target PLL, wherein the target PLL satisfies conditions specified in the PLL configuration; and
in response to finding the target PLL, control the clock switching network to provide the first core clock via the target PLL.

18. The HPS control block as recited in claim 17, wherein the control logic is further configured to identify a plurality of PLLS PLLs operable to provide the first core clock.

19. The HPS control block as recited in claim 18, wherein the control logic is further configured to first search only currently enabled PLLs in response to detecting the request indicates an enabled PLL is preferred.

20. The HPS control block as recited in claim 19, wherein in response to determining an enabled PLL is not available, the HPS control block is further configured to select an unused PLL as the target PLL.

21. A clock source switching system comprising:
a clock switching network (CSN) configured to provide a plurality of core clocks, each of said core clocks being provided from one of a plurality of phase locked loops (PLLs);
a clock control circuit coupled to receive a software request that specifies a requested PLL configuration for one of a plurality of clock outputs, wherein the clock control circuit is configured to select one of the plurality of PLLs that matches the requested configuration and to control the CSN to connect the selected PLL to the one of the plurality of clock outputs;
wherein the control circuit is configured to perform a search of the PLLs according to one of a plurality of methods indicated by the request.

22. The clock source switching system as recited in claim 21, wherein said methods include: static switching and dynamic switching.

* * * * *

UNITED STATES PATENT AND TRADEMARK OFFICE
CERTIFICATE OF CORRECTION

| | | Page 1 of 1 |
|---|---|---|
| PATENT NO. | : 8,862,926 B2 | |
| APPLICATION NO. | : 13/211004 | |
| DATED | : October 14, 2014 | |
| INVENTOR(S) | : Josh P. de Cesare et al. | |

It is certified that error appears in the above-identified patent and that said Letters Patent is hereby corrected as shown below:

In the Claims:

Column 18, Claim 18, Line 37, please delete "PLLS PLLs operable" and substitute -- PLLs operable --.

Signed and Sealed this
Sixth Day of January, 2015

Michelle K. Lee
*Deputy Director of the United States Patent and Trademark Office*